(12) United States Patent
Joshi et al.

(10) Patent No.: US 10,978,395 B2
(45) Date of Patent: Apr. 13, 2021

(54) METHOD OF MANUFACTURING A SEMICONDUCTOR DEVICE HAVING A POWER METALLIZATION STRUCTURE

(71) Applicant: Infineon Technologies Austria AG, Villach (AT)

(72) Inventors: Ravi Keshav Joshi, Villach (AT); Rainer Pelzer, Wernberg (AT); Axel Bürke, Dresden (DE); Sven Schmidbauer, Dresden (DE); Michael Nelhiebel, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/917,145

(22) Filed: Jun. 30, 2020

(65) Prior Publication Data
US 2020/0335448 A1    Oct. 22, 2020

Related U.S. Application Data

(62) Division of application No. 16/048,667, filed on Jul. 30, 2018, now Pat. No. 10,734,320.

(51) Int. Cl.
| | | |
|---|---|---|
| *H01L 23/532* | (2006.01) | |
| *H01L 21/768* | (2006.01) | |
| *H01L 23/528* | (2006.01) | |

(52) U.S. Cl.
CPC .... *H01L 23/53238* (2013.01); *H01L 21/7685* (2013.01); *H01L 23/5286* (2013.01)

(58) Field of Classification Search
CPC .......... H01L 23/5286; H01L 23/53228; H01L 23/53233; H01L 23/53238
See application file for complete search history.

(56) References Cited

U.S. PATENT DOCUMENTS

| | | | |
|---|---|---|---|
| 4,988,423 | A | 1/1991 | Yamamoto et al. |
| 5,578,522 | A | 11/1996 | Nakamura et al. |
| (Continued) | | | |

FOREIGN PATENT DOCUMENTS

| | | |
|---|---|---|
| DE | 102004059389 A1 | 6/2006 |
| DE | 102006052202 B3 | 2/2008 |
| (Continued) | | |

*Primary Examiner* — Zandra V Smith
*Assistant Examiner* — Molly K Reida
(74) *Attorney, Agent, or Firm* — Murphy, Bilak & Homiller, PLLC

(57) ABSTRACT

A semiconductor device includes a semiconductor substrate, a power metallization structure formed above the semiconductor substrate and a barrier layer formed between the power metallization structure and the semiconductor substrate. The barrier layer is configured to prevent diffusion of metal atoms from the power metallization structure in a direction toward the semiconductor substrate. The power metallization structure is in direct contact with the barrier layer or an electrically conductive layer formed on the barrier layer in a first region. The semiconductor device further includes a passivation layer interposed between the barrier layer and the power metallization structure in a second region. Corresponding methods of manufacturing the semiconductor device are also described.

18 Claims, 12 Drawing Sheets

(56) References Cited

U.S. PATENT DOCUMENTS

| | | | |
|---|---|---|---|
| 6,020,640 A | * | 2/2000 | Efland .................... H01L 24/13 |
| | | | 257/751 |
| 6,362,525 B1 | | 3/2002 | Rahim |
| 6,544,880 B1 | | 4/2003 | Akram |
| 6,576,539 B1 | | 6/2003 | Lin |
| 7,071,537 B2 | | 7/2006 | Kelberlau et al. |
| 7,122,902 B2 | | 10/2006 | Hatano et al. |
| 9,196,560 B2 | | 11/2015 | Roth et al. |
| 9,397,022 B2 | | 7/2016 | Roth et al. |
| 9,831,206 B2 | | 11/2017 | Raravikar et al. |
| 10,304,782 B2 | | 5/2019 | Mataln et al. |
| 2001/0036804 A1 | | 11/2001 | Mueller et al. |
| 2002/0149118 A1 | | 10/2002 | Yamaguchi et al. |
| 2002/0149958 A1 | | 10/2002 | Kunikiyo |
| 2003/0183913 A1 | | 10/2003 | Robl et al. |
| 2005/0179068 A1 | | 8/2005 | Rueb et al. |
| 2005/0239277 A1 | | 10/2005 | Mercer et al. |
| 2005/0258484 A1 | | 11/2005 | Itou |
| 2007/0222087 A1 | | 9/2007 | Lee et al. |
| 2007/0228543 A1 | | 10/2007 | Walter et al. |
| 2008/0001162 A1 | | 1/2008 | Hackenberger et al. |
| 2008/0254600 A1 | * | 10/2008 | Liu .................... H01L 21/76831 |
| | | | 438/494 |
| 2010/0207237 A1 | | 8/2010 | Yao et al. |
| 2010/0314725 A1 | | 12/2010 | Gu et al. |
| 2012/0235278 A1 | | 9/2012 | Shigihara et al. |
| 2013/0203214 A1 | | 8/2013 | Isobe et al. |
| 2014/0061823 A1 | | 3/2014 | Kam et al. |
| 2015/0115391 A1 | | 4/2015 | Roth et al. |
| 2015/0348987 A1 | | 12/2015 | Lee et al. |
| 2016/0268184 A1 | * | 9/2016 | Hirano .................... C25D 5/022 |
| 2017/0098620 A1 | | 4/2017 | Roth et al. |
| 2018/0145045 A1 | | 5/2018 | Zundel et al. |
| 2018/0350760 A1 | | 12/2018 | Usami |

FOREIGN PATENT DOCUMENTS

| | | |
|---|---|---|
| DE | 102010061189 A1 | 6/2011 |
| DE | 102012109995 A1 | 4/2014 |
| DE | 102015219183 A1 | 4/2017 |
| DE | 102016122318 A1 | 5/2018 |
| JP | H01309340 A | 12/1989 |
| WO | 2016024946 A1 | 2/2016 |

* cited by examiner

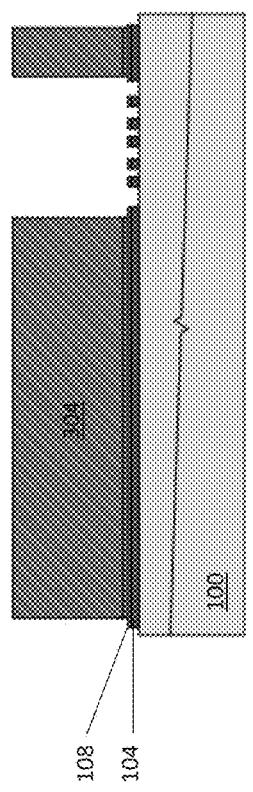
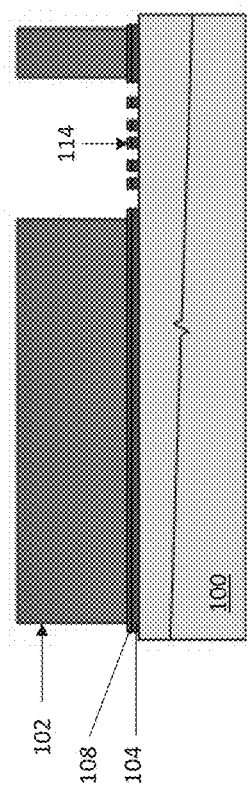
Figure 5E
Figure 5F
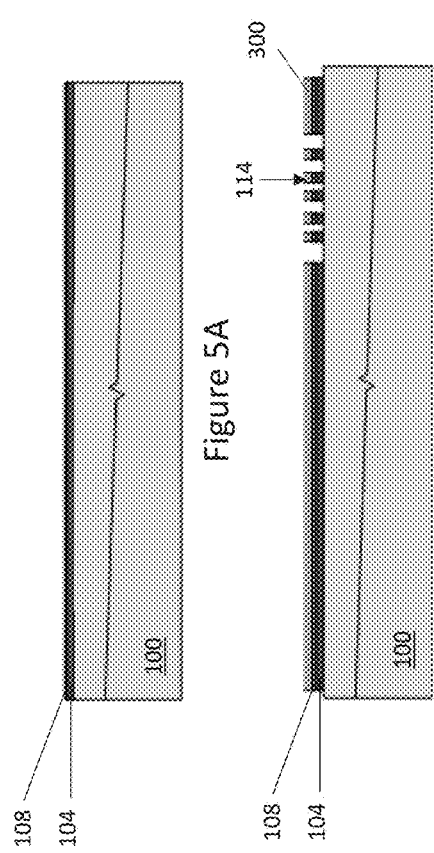
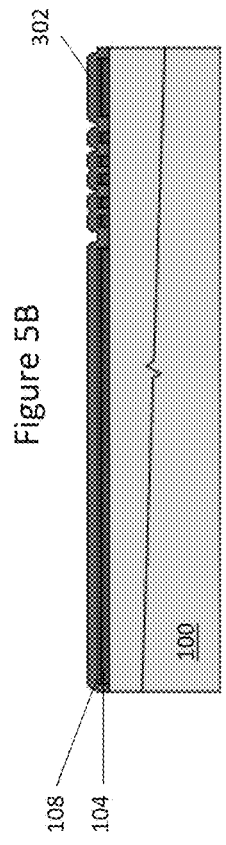
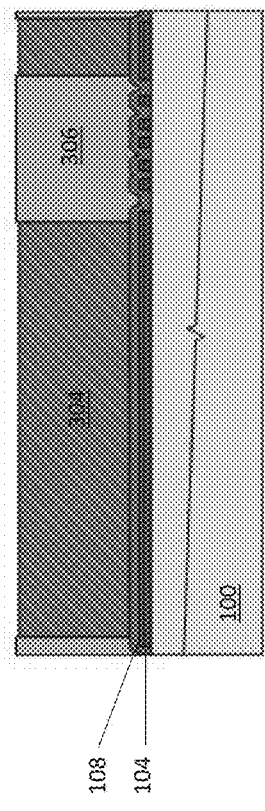
Figure 5A
Figure 5B
Figure 5C
Figure 5D

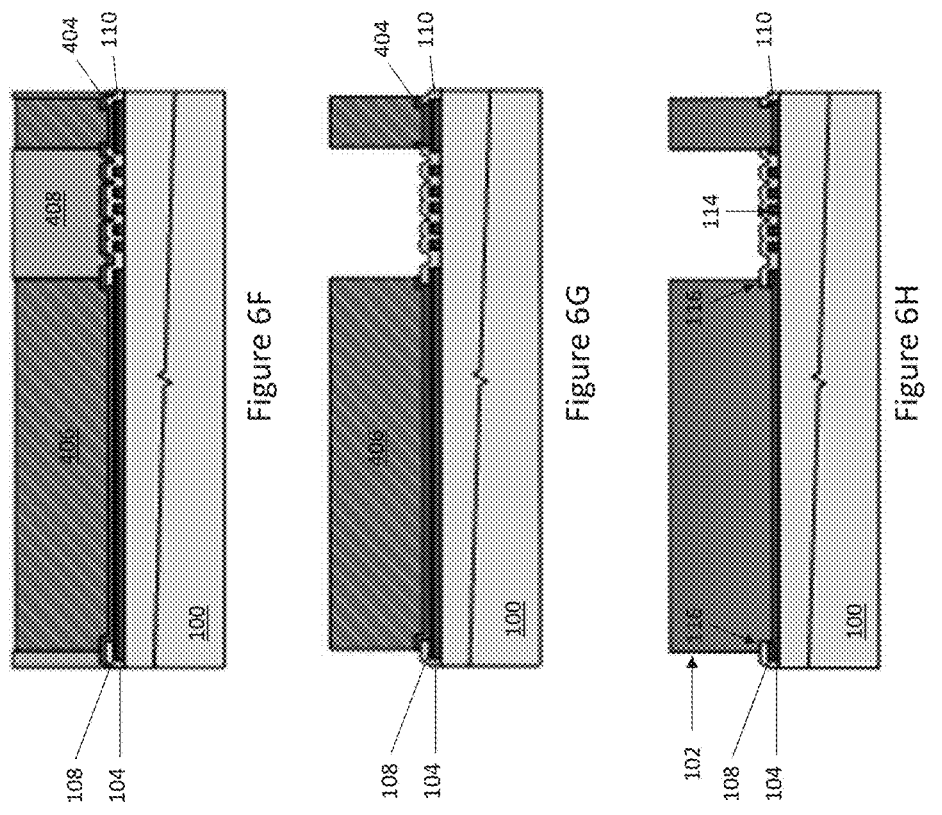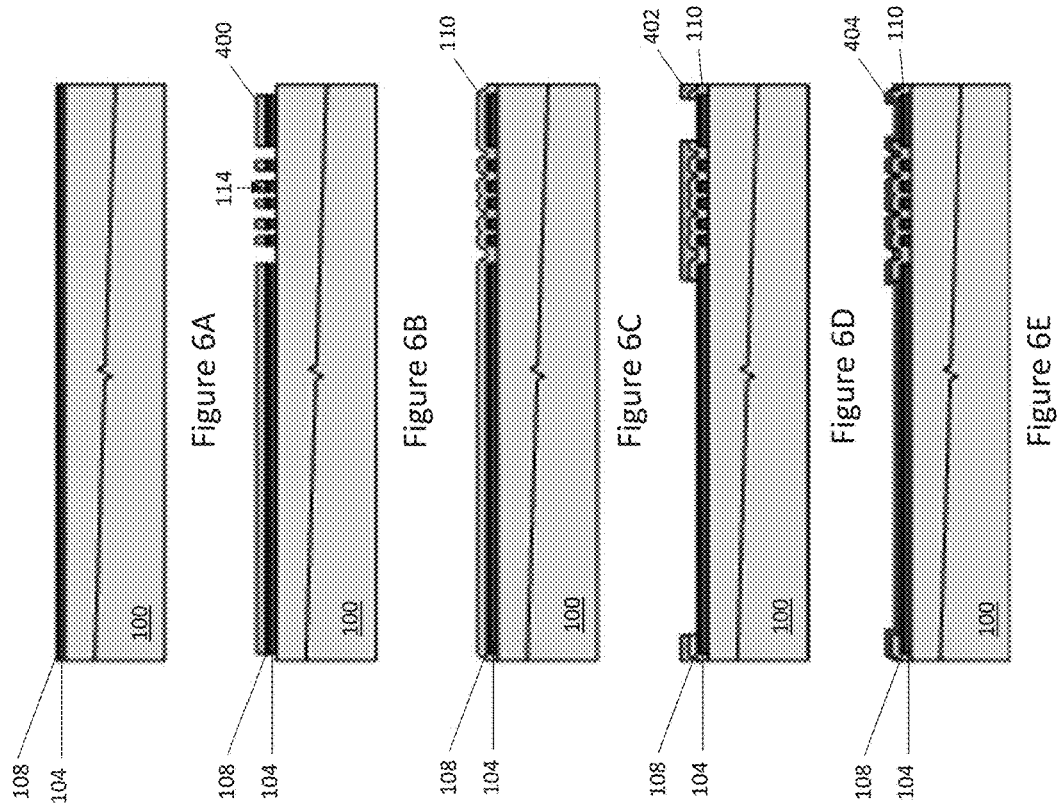

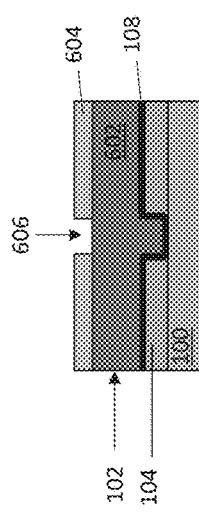
Figure 8D
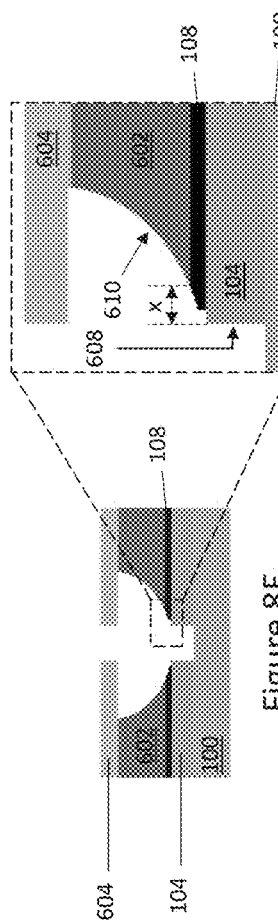
Figure 8E
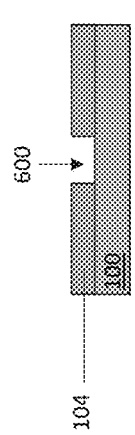
Figure 8A
Figure 8B
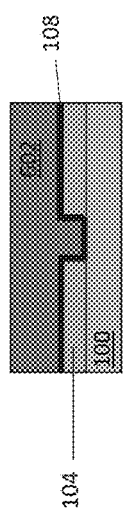
Figure 8C

METHOD OF MANUFACTURING A SEMICONDUCTOR DEVICE HAVING A POWER METALLIZATION STRUCTURE

BACKGROUND

Copper is widely used as a power metallization in semiconductor devices. However, when a copper film is subjected to temperature cycling, the copper film undergoes elastic and plastic deformation which induces stress on the surrounding elements such as the barrier, ILD (interlayer dielectric), passivation, etc. The stress induced by the copper film can lead to one or more failure modes such as cracks in the passivation and/or in the device substrate, delamination between the copper film metal and the barrier, etc. The induced stress is strongly dependent on morphology of the power metal after structuring. Hence, improved measures are needed for mitigating the stress induced by copper films used in semiconductor devices.

Moreover, thick copper has low routing density due to low pitch. An increase in routing density can be realized by adding additional routing layers, which includes metal deposition and patterning, ILD deposition for insulation, and via etch to connect the metal layers. This adds to the overall cost of the semiconductor device. For power technologies with thick copper metallization and bonding on active areas, additional softer (e.g. aluminum) layers increase the layout complexity. Copper damascene processes circumvent such problems, but at extremely high additional costs. Hence, improved measures are needed for increasing routing density when using copper metallization in semiconductor devices.

SUMMARY

According to an embodiment of a semiconductor device, the semiconductor device comprises: a semiconductor substrate; a power metallization structure formed above the semiconductor substrate; a barrier layer formed between the power metallization structure and the semiconductor substrate, the barrier layer configured to prevent diffusion of metal atoms from the power metallization structure in a direction toward the semiconductor substrate, the power metallization structure being in direct contact with the barrier layer or an electrically conductive layer formed on the barrier layer in a first region; and a passivation layer interposed between the barrier layer and the power metallization structure in a second region.

In an embodiment, the barrier layer may be structured in the second region as a signal routing structure.

Separately or in combination, the power metallization structure may be disposed over the signal routing structure in the second region and the signal routing structure may be insulated from the power metallization structure by the passivation layer in the second region.

Separately or in combination, the power metallization structure may be structured independently of the signal routing structure in the second region.

Separately or in combination, the first region and the second region may be directly adjoining, the power metallization structure and the barrier layer may be unpatterned in the first region and the second region, and the passivation layer may cover a periphery of the barrier layer in the second region.

Separately or in combination, the barrier layer may laterally extend beyond side faces of the power metallization structure in the second region.

Separately or in combination, the barrier layer may laterally extend beyond side faces of the power metallization structure in the second region by between 500 nm and 5 microns.

Separately or in combination, the passivation layer may be interposed between the barrier layer and the power metallization structure in a section of the second region spaced apart from the first region.

Separately or in combination, the barrier layer may be structured as a signal routing structure in the section of the second region spaced apart from the first region.

Separately or in combination, the power metallization structure may be disposed over the signal routing structure in the section of the second region spaced apart from the first region and the signal routing structure may be insulated from the power metallization structure by the passivation layer.

Separately or in combination, the power metallization structure may be structured independently of the signal routing structure in the section of the second region spaced apart from the first region.

Separately or in combination, the semiconductor device may further comprise an intermediate layer interposed between the barrier layer and the passivation layer in the second region, and the intermediate layer may be structured identically as the barrier layer in the second region.

Separately or in combination, the barrier layer may comprise TiW, the intermediate layer may comprise AlCu and the power metallization structure may comprise Cu.

Separately or in combination, the semiconductor device may further comprise an intermediate layer interposed between the passivation layer and the power metallization structure in the second region.

Separately or in combination, the barrier layer may comprise TiW, the intermediate layer may comprise TiW and the power metallization structure may comprise Cu.

Separately or in combination, the power metallization structure may be omitted above the barrier layer in the second region.

According to an embodiment of a method of manufacturing a semiconductor device, the method comprises: forming a barrier layer above a semiconductor substrate, the barrier layer configured to prevent diffusion of metal atoms from above the barrier layer in a direction toward the semiconductor substrate; structuring the barrier layer; and after structuring the barrier layer, forming a power metallization structure above the structured barrier layer without forming an additional barrier layer for the power metallization structure, the power metallization structure being in direct contact with the barrier layer or an electrically conductive layer formed on the barrier layer in a first region.

In an embodiment, forming the power metallization structure may comprise: after structuring the barrier layer, forming an adhesion promoting layer on the barrier layer and a Cu layer on the adhesion promoting layer, the adhesion promoting layer configured to increase adhesion of the power metallization structure to the barrier layer in the first region; forming a mask on the Cu layer, the mask having openings aligned with features previously structured into the barrier layer; and isotropically etching the Cu layer and the adhesion promoting layer through the openings in the mask, to structure the power metallization structure and so that the barrier layer laterally extends beyond side faces of the power metallization structure in regions aligned with the openings in the mask. In the case of Cu metallization, the adhesion promoting layer may not be bound to the (thick) Cu layer after sputtering and etching, but may instead be formed as part of an electro-chemical deposition (ECD) process used to form the Cu layer.

Separately or in combination, the method may further comprise: before structuring the barrier layer, forming a protective layer on the barrier layer which is configured to prevent oxidation of the barrier layer during the structuring.

Separately or in combination, forming the power metallization structure may comprise: after structuring the protective layer and the barrier layer, forming a Cu seed layer on the protective layer; forming a mask on the Cu seed layer in a second region; forming a Cu layer on the Cu seed layer in the first region but not in the second region where the mask is present; and after forming the Cu layer, removing the mask and the Cu seed layer from the protective layer in the second region.

Separately or in combination, forming the power metallization structure may comprise: after structuring the protective layer and the barrier layer, forming a passivation layer on the protective layer; removing the passivation layer in the first region but not in a second region; forming a Cu seed layer on the protective layer in the first region and on the passivation layer in the second region; and forming a Cu layer on the Cu seed layer at least in the first region.

Separately or in combination, the method may further comprise: before forming the Cu layer, forming a mask on the Cu seed layer in the second region so that the Cu layer is formed on the Cu seed layer in the first region but not in the second region where the mask is present; and after forming the Cu layer, removing the mask.

Separately or in combination, the method may further comprise: after removing the mask, removing the Cu seed layer from the passivation layer in the second region.

Separately or in combination, the Cu layer may be formed in the first region and in the second region and the passivation layer may be interposed between the barrier layer and the Cu layer in the second region.

Separately or in combination, the barrier layer may be structured in the second region as a signal routing structure and the method may further comprise: structuring the Cu layer in the second region independently of the signal routing structure.

Separately or in combination, forming the power metallization structure may comprise: after structuring the protective layer and the barrier layer, forming a passivation layer on the protective layer; removing the passivation layer in the first region but not in a second region; and forming a Cu layer on the protective layer in the first region and on the passivation layer in the second region by physical vapor deposition.

Separately or in combination, the method may further comprise: removing the Cu layer from the passivation layer in the second region.

Separately or in combination, the barrier layer may be structured in the second region as a signal routing structure and the method may further comprise: structuring the Cu layer in the second region independently of the signal routing structure.

Separately or in combination, the protective layer may be deposited in situ with the barrier layer and the protective layer and the barrier layer may be structured concurrently.

Separately or in combination, the protective layer may comprise AlCu and the barrier layer may comprise TiW.

Separately or in combination, forming the protective layer may comprise: depositing a layer of oxide on the barrier layer using atomic layer deposition.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 5A through 5F illustrate an embodiment of a method of manufacturing a semiconductor device.

FIGS. 6A through 6H illustrate another embodiment of a method of manufacturing a semiconductor device.

FIGS. 8A through 8E illustrate another embodiment of a method of manufacturing a semiconductor device.

DETAILED DESCRIPTION

The embodiments described herein provide a semiconductor device that includes a semiconductor substrate, a power metallization structure formed above the semiconductor substrate, and a barrier layer formed between the power metallization structure and the semiconductor substrate. The barrier layer prevents diffusion of metal atoms from the power metallization structure in a direction toward the semiconductor substrate. The power metallization structure is in direct contact with the barrier layer or an electrically conductive layer formed on the barrier layer in a first region, and a passivation layer is interposed between the barrier layer and the power metallization structure in a second region. In one embodiment, the barrier layer is structured as a signal routing structure in the second region. According to this embodiment, signal routing structure is implemented by the barrier layer and not the overlying power metallization structure which may have lower routing density due to its relatively thick construction compared to the barrier layer. In another embodiment, the first region and the second region are directly adjoining, the power metallization structure and the barrier layer are unpatterned in the first region and the second region, and the passivation layer covers a periphery of the barrier layer in the second region. According to this embodiment, a washer-like structure is formed in the second region and includes the passivation layer separating the barrier layer from the power metallization structure. The washer-like structure surrounds the first region where the power metallization structure and the barrier layer are not separated from one another by the passivation layer. In another embodiment, the semiconductor device includes both the signal routing structure and the washer-like structure. Corresponding manufacturing methods are also described.

Figure 1:
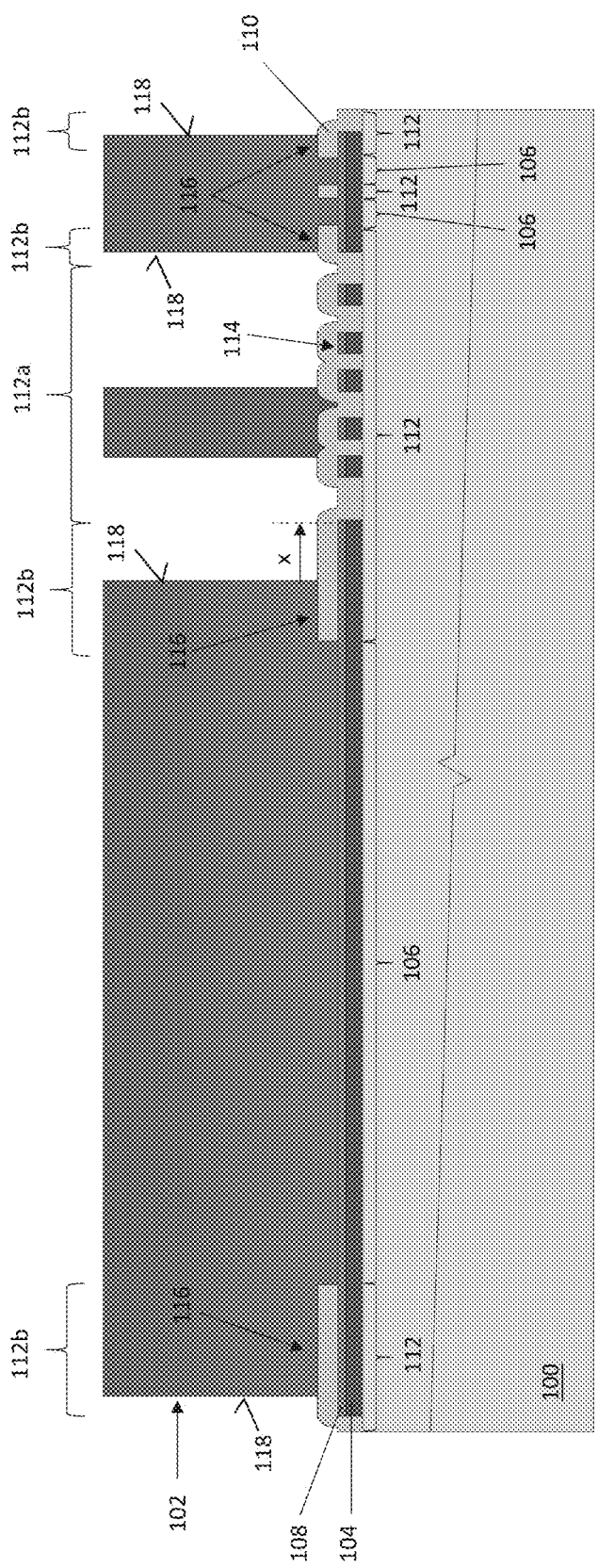
FIG. 1 illustrates a partial sectional view of an embodiment of a semiconductor device.

FIG. 1 illustrates a partial sectional view of a semiconductor device. The semiconductor device includes a semiconductor substrate 100, a power metallization structure 102 formed above the semiconductor substrate 100, and a barrier layer 104 formed between the power metallization structure 102 and the semiconductor substrate 100. The barrier layer 104 may be in contact with the semiconductor substrate 100 as shown in FIG. 1, or may be separated from the semiconductor substrate 100 by one or more insulating layers. In either case, the semiconductor substrate 100 may be any type of semiconductor substrate typically used to implement logic and/or power semiconductor devices. For example, the semiconductor substrate 100 may be a Si substrate, a Si-on-insulator (SOI) substrate, a GaN substrate, a SiC substrate, a GaAs substrate, another type of III-V or II-VI substrate, etc.

Various power metallization structure/barrier layer combinations are contemplated. For example, the power metallization structure 102 may comprise Cu and the barrier layer 104 may comprise at least one of Ti, TiW, W and Ta. In another embodiment, the power metallization structure 102 comprises Al or an Al alloy and the barrier layer 104 comprises at least one of Ti, TiN and W. In yet another embodiment, the power metallization structure 102 comprises Au and the barrier layer 104 is compatible with Au. A common barrier layer for at least Cu and Al metal systems is TiW. Still other power metallization structure/barrier layer combinations are possible.

The barrier layer 104 is configured to prevent diffusion of metal atoms from the power metallization structure 102 in a direction toward the semiconductor substrate 100. For example, in the case of Cu metallization, the barrier layer 104 may comprise TiW or any other suitable metal layer or stack of metal sublayers configured to prevent diffusion of Cu atoms from the power metallization structure 102 in a direction toward the semiconductor substrate 100.

In a first region 106 of the semiconductor device, the power metallization structure 102 is in direct contact with the barrier layer 104 or an intermediate electrically conductive layer 108 formed on the barrier layer 104. That is, there is direct electrical contact between the power metallization structure 102 and the barrier layer 104 or intermediate layer 108 formed on the barrier layer 104 in the first region 106 of the semiconductor device.

In one embodiment, the intermediate layer 108 is an electrically conductive adhesion promoting layer configured to increase adhesion of the power metallization structure 102 to the underlying barrier layer 104 in the first region 106. For Cu metallization, the barrier layer 104 may comprise a relatively thick layer of TiW whereas the intermediate layer 108 may comprise a relatively thin layer of TiW or Ti. An intermediate layer 108 of TiW or Ti may be an ineffective barrier against the migration of Cu atoms if relatively thin, but increases the adhesion of the power metallization structure 102 to the barrier layer 104 if formed as part of the power metallization structure process. In the case of Cu metallization, the adhesion promoting layer 108 may not be bound to the (thick) underlying Cu layer after sputtering and etching, but may instead be formed as part of an electrochemical deposition (ECD) process used to form the Cu layer.

A thin oxidation layer may inevitably form on the barrier layer 104 during structuring. To achieve proper adhesion, the intermediate layer 108 of TiW or Ti and thicker Cu metallization may be formed via the same process. Alternatively, the oxidation may be prevented which is described in the next embodiment.

In another embodiment, the intermediate layer 108 is an anti-oxidation layer formed on the barrier layer 104 prior to structuring of the barrier layer 104. As will be described in more detail later herein, the barrier layer 104 is structured/patterned prior to formation of the power metallization structure 102. Depending on the composition of the barrier layer 104, the barrier layer 104 may oxidize when exposed during the structuring/patterning process. For example, TiW oxidizes when exposed which may decrease the adherence of the barrier layer 104 to the power metallization structure 102. The anti-oxidation layer 108 protects the barrier layer 104 from oxidation during structuring of the barrier layer 104. For Cu metallization, the barrier layer 104 may comprise TiW whereas the intermediate layer 108 may comprise AlCu. The intermediate layer 108 of AlCu is effective at preventing oxidation of TiW and other types of barrier layer materials. Still other types of materials may be used for the intermediate layer 108. Depending on the composition of the intermediate layer 108 and processing parameters involved, the intermediate layer 108 may or may not be present in the first region 106 of the final semiconductor device.

The semiconductor device also includes an electrically insulating passivation layer 110 interposed between the barrier layer 104 and the power metallization structure 102 in a second region 112 of the semiconductor device different than the first region 106. The intermediate layer 108 is interposed between the barrier layer 104 and the passivation layer 110 in the second region 112. In the case of the intermediate layer 108 being an anti-oxidation layer for the barrier layer 104 as previously described herein, the intermediate layer 108 is structured identically as the barrier layer 104 in the second region 112 since the intermediate layer 108 is formed on the barrier layer 104 before structuring of the barrier layer 104.

In a first section 112a of the second region 112, the barrier layer 104 may be structured as a signal routing structure 114. Since the barrier layer 104 is significantly thinner than the power metallization structure 102, e.g. 2×, 5×, 10×, 20×, 50× or more thinner, the barrier layer 104 has a higher routing density than the power metallization structure 102. The power metallization structure 102 may be disposed over the signal routing structure 114 in the first section 112a of the second region 112 of the semiconductor device as shown in FIG. 1. In this case, the signal routing structure 114 is insulated from the overlying power metallization structure 102 by the passivation layer 110 in the first section 112a of the second region 112. The power metallization structure 102 may be structured independently of the signal routing structure 114 in the first section 112a of the second region 112. That is, since the signal routing structure 114 is formed before the power metallization structure 102, the power metallization structure 102 and the signal routing structure 114 may have different or independent routing configurations.

In a second section 112b of the second region 112 of the semiconductor device, the first and second regions 106, 112 are directly adjoining. The power metallization structure 102 and the barrier layer 104 may be unpatterned in the first region 106 and in the second section 112b of the second region 112, and the passivation layer 110 may cover the periphery of the barrier layer 104 in the second section 112b of the second region 112 to form a washer-like structure 116 in the second region 112 which includes the passivation layer 110 separating the barrier layer 104 from the power metallization structure 102. The washer-like structure 116 surrounds the first region 106 where the power metallization structure 102 and the barrier layer 104 are not separated from one another by the passivation layer 110.

The barrier layer 104 may laterally extend beyond the side faces 118 of the power metallization structure 102 in the second section 112b of the second region 112 to form the washer-like structure 116. For example, the barrier layer 104 may laterally extend beyond the side faces 118 of the power metallization structure 102 in the second section 112b of the second region 112 by an amount x which is between 500 nm and 5 microns to form the washer-like structure 116. The washer-like structure 116 acts as a crack preventing compressive interlayer.

The semiconductor device may include both the barrier layer signal routing structure 114 in the first section 112a of the second region 112 of the device and the washer-like structure 116 in the second section 112b of the second region 112 of the device, e.g., as shown in FIG. 1. In this embodiment, the barrier layer 104 is structured as a signal routing structure 114 and the passivation layer 110 is interposed between the signal routing structure 114 and the power metallization structure 102 in the first section 112a of the second region 112 of the semiconductor device. The power metallization structure 102 may be disposed over the barrier layer signal routing structure 114. In this case, the barrier layer signal routing structure 114 is insulated from the power metallization structure 102 by the passivation layer 110 in the first section 112a of the second region 112 of the device. The power metallization structure 102 may be structured independently of the barrier layer signal routing structure 114 in the first section 112a of the second region 112 of the device, as previously described herein.

FIGS. 2A through 2E illustrate an embodiment of a method of manufacturing the semiconductor device shown in FIG. 1.

Figure 2A:
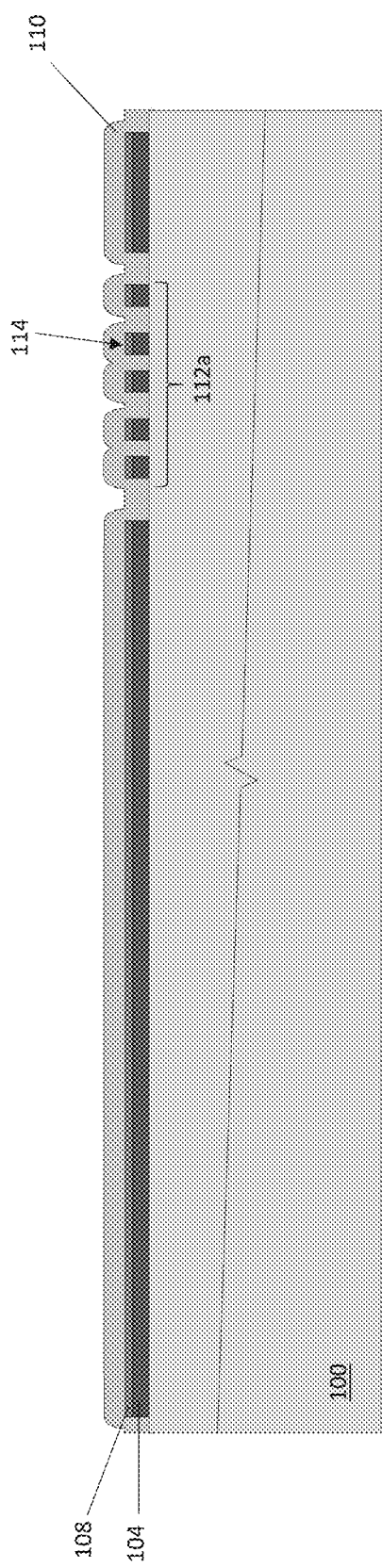
FIGS. 2A through 2E illustrate an embodiment of a method of manufacturing the semiconductor device shown in FIG. 1.

FIG. 2A shows the semiconductor device after the intermediate layer 108 is formed on the barrier layer 104, after the intermediate/barrier layer stack 104/108 is structured to form a signal routing structure 114 in the first section 112a of the second region 112 of the device, and after the passivation layer 110 is formed on the structured intermediate/barrier layer stack 104/108. According to this embodiment, the intermediate layer 108 is an anti-oxidation layer formed on the barrier layer 104 prior to structuring of the barrier layer 104. For example, the barrier layer 104 may comprise TiW and the intermediate layer 108 may comprise AlCu. In a more specific example, the intermediate layer 104 may be a 30-70 nm thick AlCu layer in-situ deposited on a TiW barrier layer 104. Subsequent alloying of such an AlCu intermediate layer 108 with a thick Cu power metallization structure 102 improves fatigue robustness.

In one embodiment, the barrier layer 104 is in-situ covered by the intermediate layer 108 so as to protect the barrier layer 104 from oxidation during the subsequent structuring/patterning process. The intermediate layer 108 may instead be formed ex-situ. Examples of the intermediate layer 108 include, but are not limited to, thin metal films e.g. 30-70 nm AlCu or Ti, ultra-thin metal films e.g. 2 nm Au, ultra-thin interlayer dielectric layers e.g. ALD (atomic layer deposited) $Al_2O_3$, etc.

The intermediate layer 108 may include one or more material sublayers, and is structured/patterned concurrently with the barrier layer 104 according to the embodiment shown in FIG. 2A. The intermediate layer 108 may remain on the barrier layer 104 through the end of manufacturing, or may be removed or diffused in a later stage. For example, the intermediate layer 108 may be removed by a dedicated removal step before beginning to form the power metallization structure 102, by diffusion of the intermediate layer 108 into the barrier layer 104 and/or power metallization structure 102 during subsequent annealing, etc. In the case of an Al-based intermediate layer 108 and a TiW barrier layer 104, the intermediate layer 108 not only protects the barrier layer 104 from oxidation during the subsequent structuring/patterning process, but also remains on the barrier layer routing structure 114 where it improves the conductivity of the barrier layer 104 which typically has a higher resistance.

The intermediate/barrier layer stack 104/108 may be structured/patterned concurrently, e.g., by a lithography-assisted plasma etching process such as Cl- and/or F-based plasma etching processes. The resulting structured intermediate/barrier layer stack 104/108 may be passivated by the passivation layer 110. Any typical passivation material may be used for the passivation layer 110, e.g., such as silicon nitride and/or silicon oxide. In the case of silicon nitride and/or silicon oxide, the passivation layer 110 may be formed by chemical vapor deposition (CVD). The barrier layer routing and washer-like structures 114, 116 are defined by the structuring/patterning process for the intermediate/barrier layer stack 104/108.

Figure 2B:
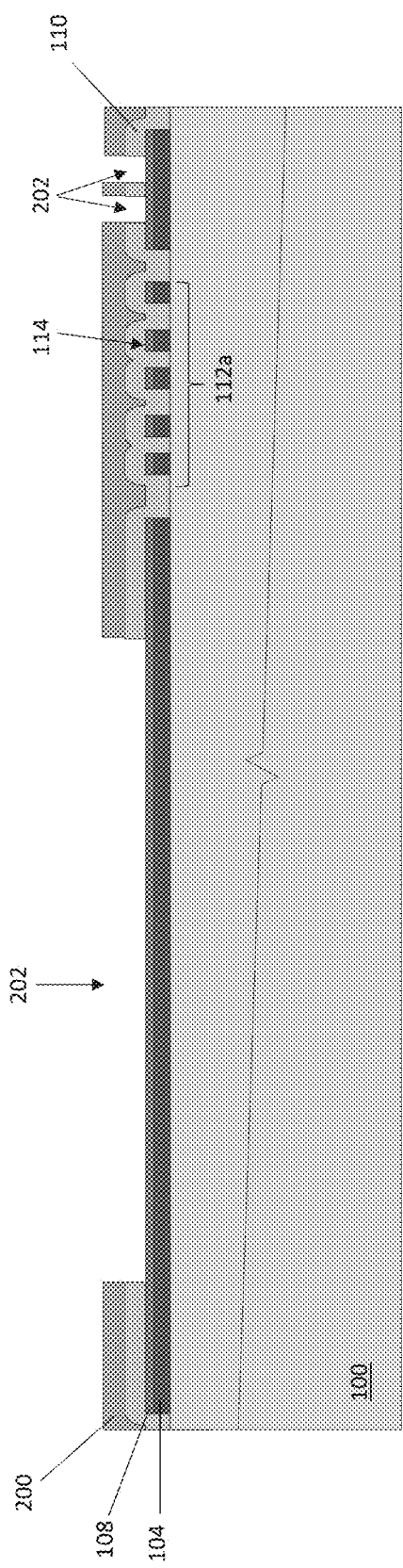

FIG. 2B shows the semiconductor device after a mask 200 such as photoresist is formed on the passivation layer 110 and after the unprotected part of the passivation layer 110 is removed to expose the barrier layer routing and washer-like structures 114, 116. For example, the passivation layer 110 may be lithographically processed and plasma structured to define via or pad openings 202 to the underlying barrier layer routing and washer-like structures 114, 116. The mask 200 is then removed.

Figure 2C:
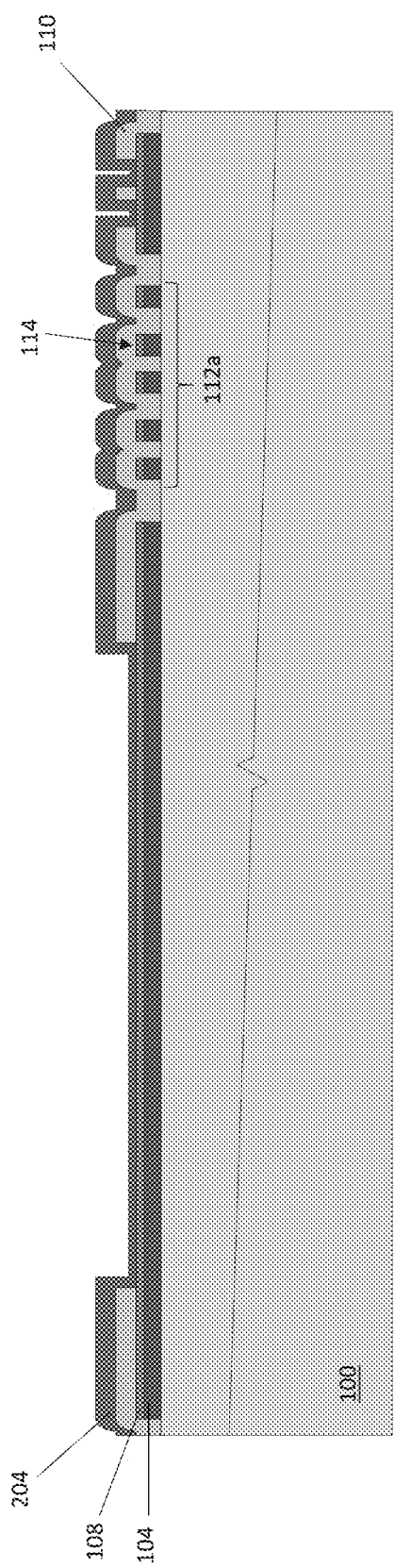

FIG. 2C shows the semiconductor device after physical vapor deposition (PVD) of a Cu seed layer 204 over the remaining passivation layer 110 and the exposed part of the intermediate layer 108. A Cu seed layer 204 may be used in the case of a Cu power metallization structure 102. The Cu seed layer 204 may be omitted for other types of power metallization materials such as Al, Au, etc. If the Cu seed layer 204 is used, a thin Al layer (not shown) may be formed on the passivation layer 110 to improve adhesion between the passivation layer 110 and the subsequently formed power metallization structure 102.

Figure 2D:
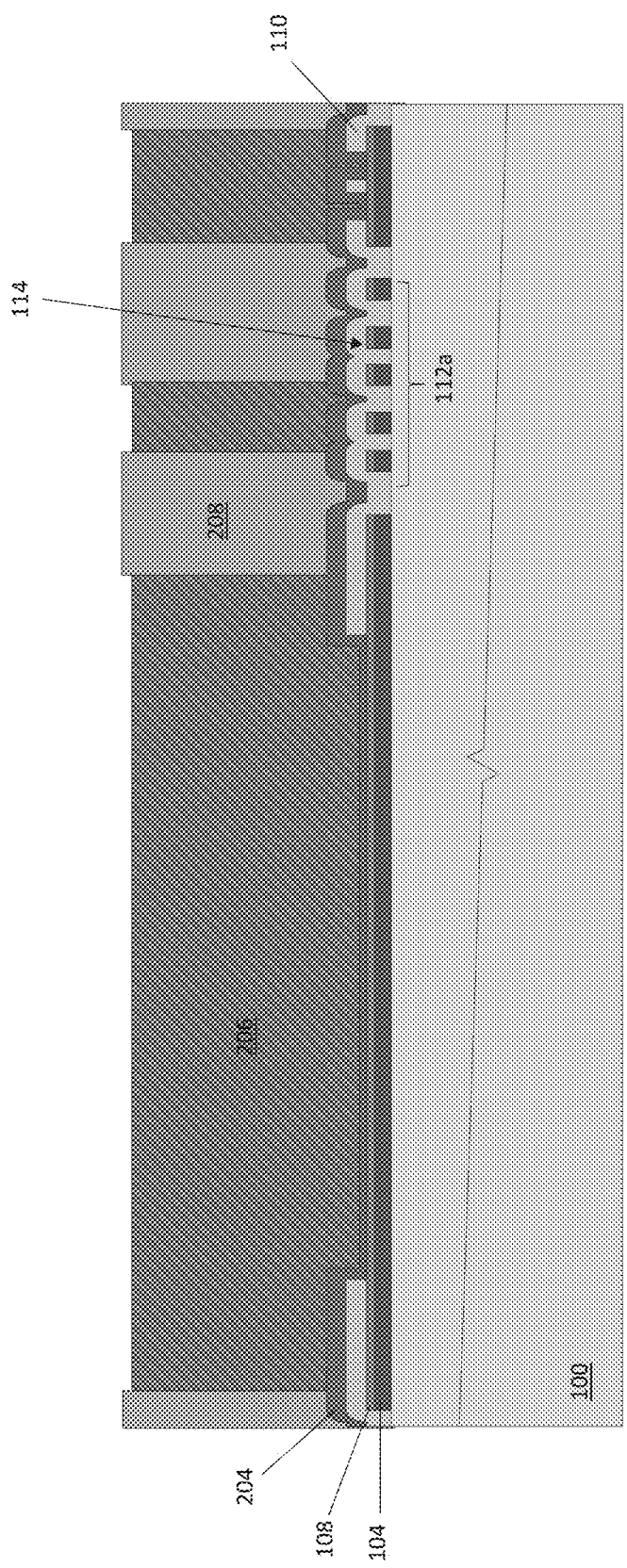

FIG. 2D shows the semiconductor device after electrochemical deposition (ECD) of a thick Cu power metal 206 on the Cu seed layer 204. A mask 208 such as a photoresist may be used to prevent ECD of the thick Cu power metal 206 in certain areas of the device, e.g., to allow for independent structuring of the thick Cu power metal 206 over the routing structure 114 formed by the barrier layer 104 which remains covered by the passivation layer 110 in this region 112a of the device. As shown in FIGS. 2C and 2D, the power metallization structure 102 is formed above the structured barrier layer 104 without forming an additional barrier layer for the power metallization structure 102.

Figure 2E:
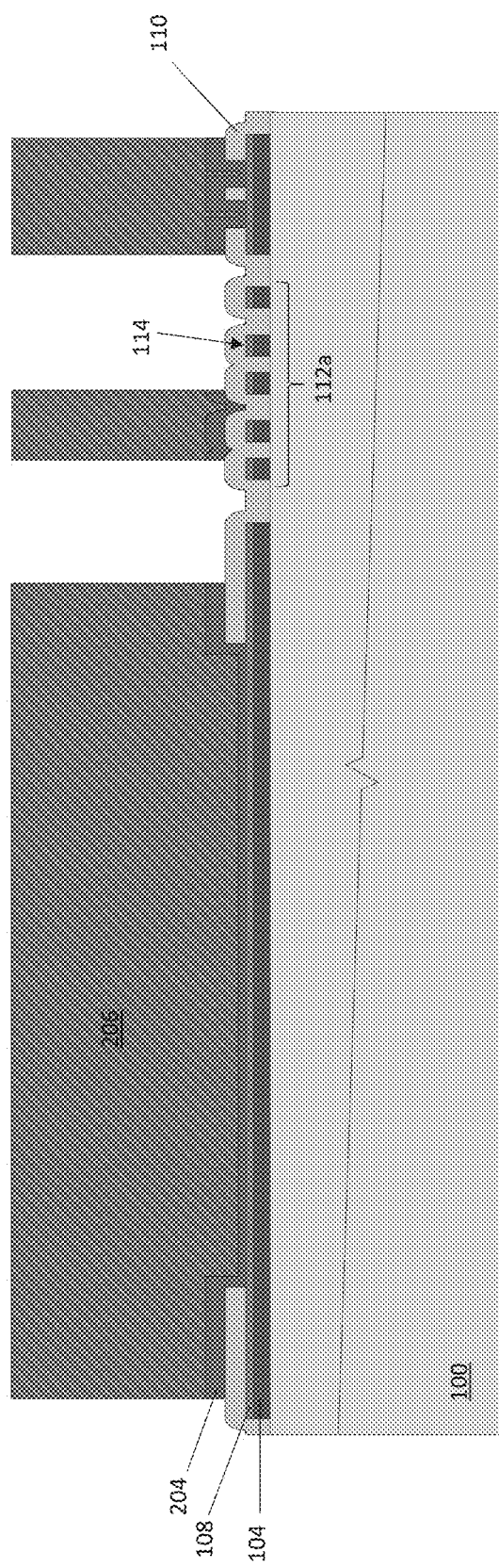

FIG. 2E shows the semiconductor device after the mask 208 is removed. The thick Cu power metal 206 may then be used as a hard mask for removing the exposed Cu seed layer 204, e.g., by blanket wet etching. The passivation layer 110 ensures the underlying barrier layer routing structure 114 is electrically insulated from the overlying power metallization structure 102, if present over the routing structure 114. The semiconductor device is then annealed to complete the power metallization structure 102. The resulting device is shown in FIG. 1.

As explained above, some or all of the intermediate layer 108 may diffuse as a result of the annealing process. However, in other cases there may be little to no diffusion of the intermediate layer 108. In these cases, the intermediate layer 108 remains essentially intact as shown in FIG. 1.

Figure 3:
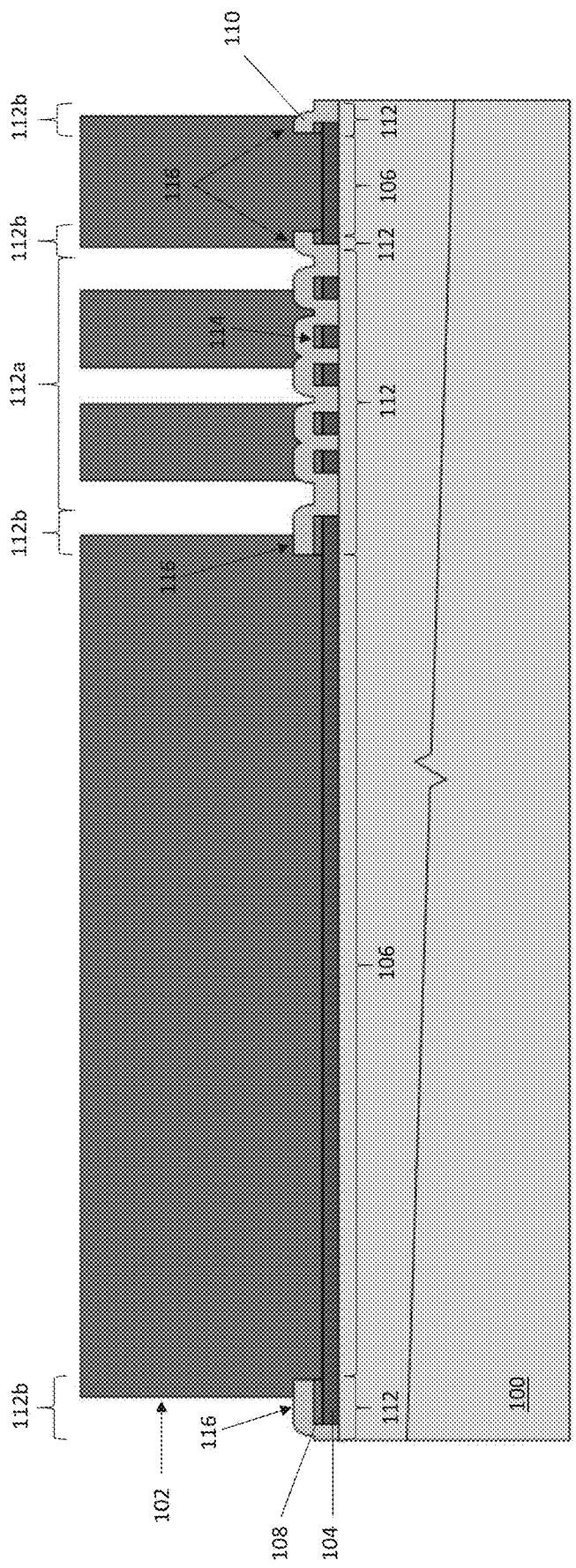
FIG. 3 illustrates a partial sectional view of another embodiment of a semiconductor device.

FIG. 3 illustrates an embodiment in which the intermediate layer 108 remains essentially intact in the barrier layer routing and washer-like structures 114, 116, but not in the region 106 where the passivation layer 110 is removed. According to this embodiment, the intermediate layer 108 diffuses into the power metallization structure 102 in this region 106 and the barrier layer 104 is in direct contact with the power metallization structure 102.

Figure 4:
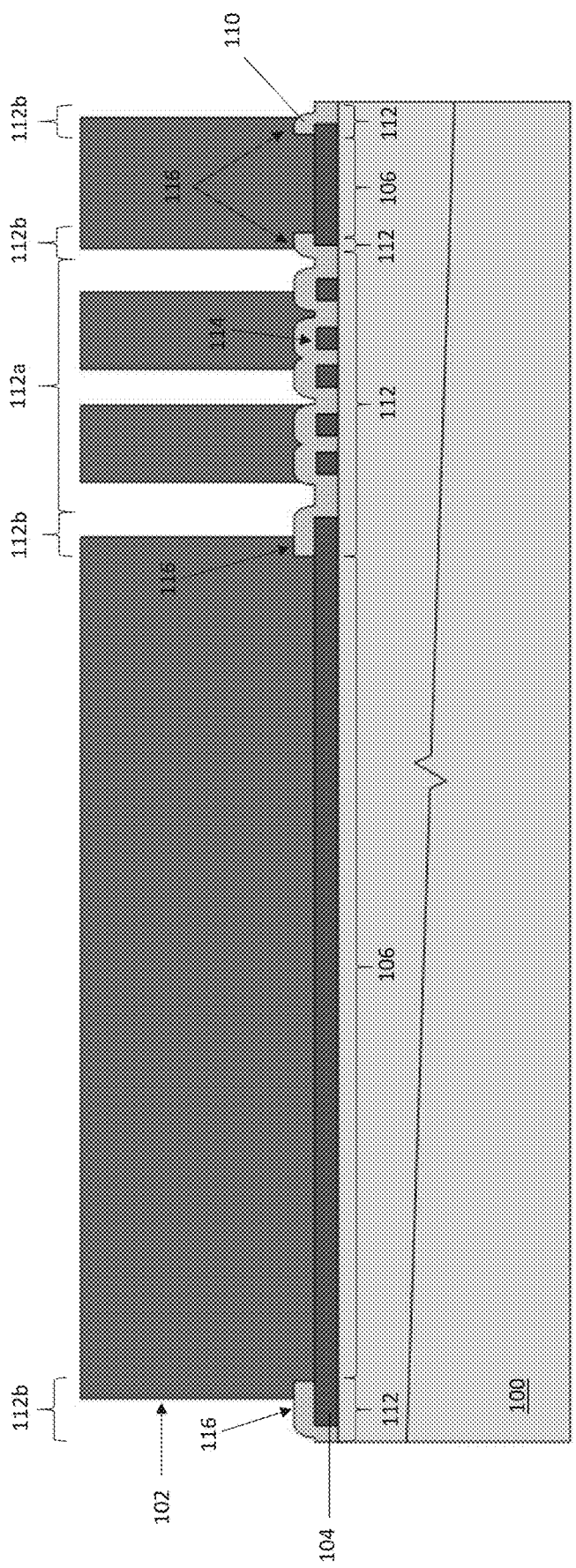
FIG. 4 illustrates a partial sectional view of another embodiment of a semiconductor device.

FIG. 4 illustrates an embodiment in which the intermediate layer 108 is not present as a defined layer in the final device. In one embodiment, the intermediate layer 108 is formed by ALD and is intrinsically removed by the subsequent ECD process used to form the power metallization structure 102 and therefore does not diffuse into either the barrier layer 104 or the power metallization structure 102. In another embodiment, the intermediate layer 108 diffuses into the barrier layer 104 and/or the power metallization structure 102. For example, in the case of AlCu as the intermediate layer 108, constituent parts of Al may diffuse into the barrier layer 104 and/or the power metallization structure 102 during the annealing process.

FIGS. 5A through 5F illustrate another embodiment of a method of manufacturing a semiconductor device having the barrier layer routing structure 114.

FIG. 5A shows the semiconductor device after a barrier layer 104 configured to prevent diffusion of metal atoms from above the barrier layer 104 in a direction toward a semiconductor substrate 100 is formed over the substrate 100, and after an intermediate layer 108 such as an anti-oxidation layer is formed on the barrier layer 104. The barrier layer 104 may be in contact with the semiconductor substrate 100 as shown in FIG. 5A, or may be separated from the semiconductor substrate 100 by one or more insulating layers. In either case, the semiconductor substrate 100 may be any type of semiconductor substrate typically used to implement logic and/or power semiconductor devices. The barrier layer 104 may be in-situ or ex-situ covered by the intermediate layer 108 so as to protect the barrier layer 104 from oxidation during subsequent structuring/patterning of the barrier layer 104, e.g., as previously described herein in connection with FIG. 2A.

FIG. 5B shows the semiconductor device after the intermediate layer 108 and the barrier layer 104 are structured/patterned concurrently using a mask 300, e.g., by a lithography-assisted plasma etching process such as Cl- and/or F-based plasma etching processes, to define the barrier layer routing structure 114. The mask 300 is then removed.

FIG. 5C shows the semiconductor device after PVD of a Cu seed layer 302 over the structure. Cu is typically used as a seed layer 302 in the case of Cu power metallization. The Cu seed layer 302 may be omitted for other types of power metallization materials such as Al, Au, etc.

FIG. 5D shows the semiconductor device after ECD of a thick Cu power metal 304 on the Cu seed layer 302. According to this embodiment, a mask 306 such as a photoresist is used to prevent ECD of the thick Cu power metal 304 over the barrier layer routing structure 114. Accordingly, the power metallization structure 102 is omitted above the barrier layer routing structure 114. Different than the embodiment illustrated in FIGS. 2A through 2E, the passivation layer 110 between the intermediate layer 108 and the power metallization structure 102 may be omitted since the power metallization structure 102 does not extend over the barrier layer routing structure 114.

FIG. 5E shows the semiconductor device after the mask 306 is removed and after using the thick Cu power metal 304 as a hard mask to remove the exposed Cu seed layer 302, e.g., by blanket wet etching.

FIG. 5F shows the semiconductor device after annealing which is performed to complete the power metallization structure 102. Different than the semiconductor devices shown in FIGS. 1, 3 and 4, the semiconductor device shown in FIG. 5F has no passivation layer between the intermediate layer 108 and the power metallization structure 102 and the power metallization structure 102 does not extend over the barrier layer routing structure 114. As explained previously herein, some or all of the intermediate layer 108 may diffuse into the barrier layer 104 and/or the power metallization structure 102 as a result of the annealing process, may be intrinsically removed by the ECD process used to form the power metallization structure 102 and therefore does not diffuse into either the barrier layer 104 or the power metallization structure 102, or may remain essentially intact.

FIGS. 6A through 6H illustrate another embodiment of a method of manufacturing a semiconductor device having the barrier layer routing structure 114.

FIG. 6A shows the semiconductor device after a barrier layer 104 configured to prevent diffusion of metal atoms from above the barrier layer 104 in a direction toward a semiconductor substrate 100 is formed over the substrate 100, and after an intermediate layer 108 such as an anti-oxidation layer is formed on the barrier layer 104. The barrier layer 104 may be in contact with the semiconductor substrate 100 as shown in FIG. 6A, or may be separated from the semiconductor substrate 100 by one or more insulating layers. In either case, the semiconductor substrate 100 may be any type of semiconductor substrate typically used to implement logic and/or power semiconductor devices. The barrier layer 104 may be in-situ or ex-situ covered by the intermediate layer 108 so as to protect the barrier layer 104 from oxidation during subsequent structuring/patterning of the barrier layer 104, e.g., as previously described herein in connection with FIG. 2A.

FIG. 6B shows the semiconductor device after the intermediate layer 108 and the barrier layer 104 are structured/patterned concurrently using a mask 400, e.g., as previously described herein in connection with FIG. 2A, to define the barrier layer routing structure 114.

FIG. 6C shows the semiconductor device after a passivation layer 110 is formed on the structured intermediate/barrier layer stack 104/108, e.g., as previously described herein in connection with FIG. 2A. The mask 400 is then removed.

FIG. 6D shows the semiconductor device after another mask 402 such as photoresist is formed on the passivation layer 110 and after the unprotected part of the passivation layer 110 is removed to expose the underlying intermediate layer 108, e.g., as previously described herein in connection with FIG. 2B.

FIG. 6E shows the semiconductor device after PVD of a Cu seed layer 404 over the passivation layer 110 and the exposed part of the intermediate layer 108, e.g., as previously described herein in connection with FIG. 2C.

FIG. 6F shows the semiconductor device after ECD of a thick Cu power metal 406 on the Cu seed layer 404. According to this embodiment, a mask 408 such as a photoresist is used to prevent ECD of the thick Cu power metal 406 over the barrier layer routing structure 114, e.g., as previously described herein in connection with FIG. 5D. Accordingly, the power metallization structure 102 does not extend over the barrier layer routing structure 114.

FIG. 6G shows the semiconductor device after the mask 408 is removed and after using the thick Cu power metal 406 as a hard mask to remove the exposed Cu seed layer 404, e.g., as previously described herein in connection with FIG. 5E.

FIG. 6H shows the semiconductor device after annealing which is performed to complete the power metallization structure 102. Similar to the semiconductor devices shown in FIGS. 1, 3 and 4, the semiconductor device shown in FIG. 6H has a passivation layer 110 between the intermediate layer 108 and the power metallization structure 102 in one region of the device. Similar to the semiconductor device shown in FIG. 5F, the power metallization structure 102 does not extend over the barrier layer routing structure 114 for the semiconductor device shown in FIG. 6H in another region of the device. As explained previously herein, some or all of the intermediate layer 108 may diffuse into the barrier layer 104 and/or the power metallization structure 102 as a result of the annealing process, may be intrinsically removed by the ECD process used to form the power metallization structure 102 and therefore does not diffuse into either the barrier layer 104 or the power metallization structure 102, or may remain essentially intact.

FIGS. 7A through 7G illustrate another embodiment of a method of manufacturing a semiconductor device having a barrier layer routing structure.

Figure 7A:
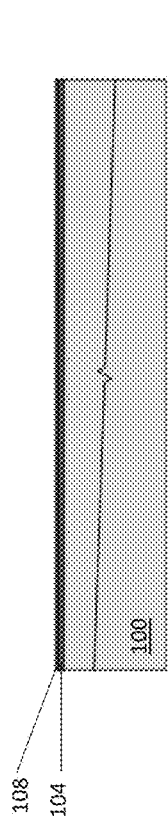
FIGS. 7A through 7G illustrate another embodiment of a method of manufacturing a semiconductor device.

FIG. 7A shows the semiconductor device after a barrier layer 104 configured to prevent diffusion of metal atoms from above the barrier layer 104 in a direction toward a semiconductor substrate 100 is formed over the substrate 100, and after an intermediate layer 108 such as an anti-oxidation layer is formed on the barrier layer 104. The barrier layer 104 may be in contact with the semiconductor substrate 100 as shown in FIG. 7A, or may be separated from the semiconductor substrate 100 by one or more insulating layers. In either case, the semiconductor substrate 100 may be any type of semiconductor substrate typically used to implement logic and/or power semiconductor devices. The barrier layer 104 may be in-situ or ex-situ covered by the intermediate layer 108 so as to protect the barrier layer 104 from oxidation during subsequent structuring/patterning of the barrier layer 104, e.g., as previously described herein in connection with FIG. 2A.

Figure 7B:
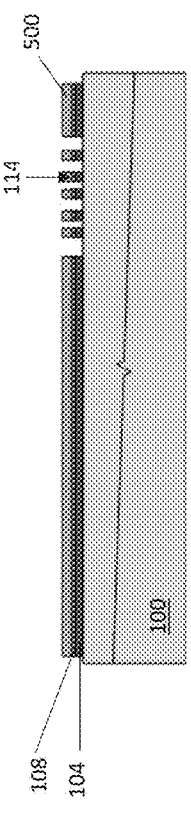

FIG. 7B shows the semiconductor device after the intermediate layer 108 and the barrier layer 104 are structured/patterned concurrently using a mask 500, e.g., as previously described herein in connection with FIG. 2A, to define the barrier layer routing structure 114.

Figure 7C:
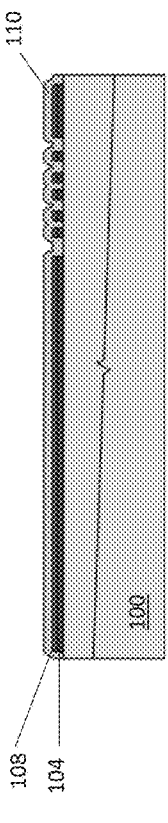

FIG. 7C shows the semiconductor device after a passivation layer 110 is formed on the structured intermediate/barrier layer stack 104/108, e.g., as previously described herein in connection with FIG. 2A.

Figure 7D:
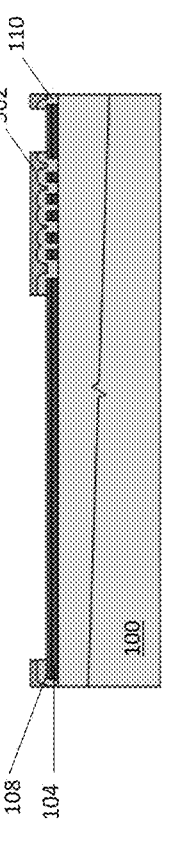

FIG. 7D shows the semiconductor device after a mask 502 such as photoresist is formed on the passivation layer 110 and after the unprotected part of the passivation layer 110 is removed to expose the barrier layer routing structure 114, e.g., as previously described herein in connection with FIG. 2B.

Figure 7E:
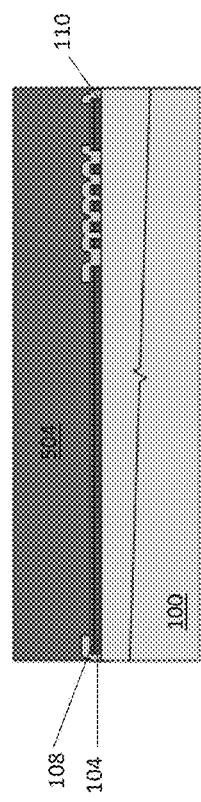

FIG. 7E shows the semiconductor device after PVD of a thick Cu power metallization 504 over the passivation layer 110 and the exposed part of the intermediate layer 108. Different than the embodiment illustrated in FIGS. 2D, 5D and 6F, the thick Cu power metallization 504 is blanket deposited and then subsequently patterned.

Figure 7F:
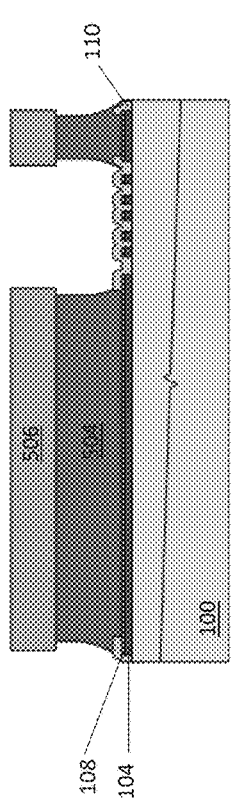

FIG. 7F shows the semiconductor device after a mask 506 such as a photoresist is formed on the blanket-deposited thick Cu power metallization 504 and after the exposed part of the thick Cu power metallization 504 is etched, e.g., via a $H_3PO_4$—$H_2O_2$ etchant solution.

Figure 7G:
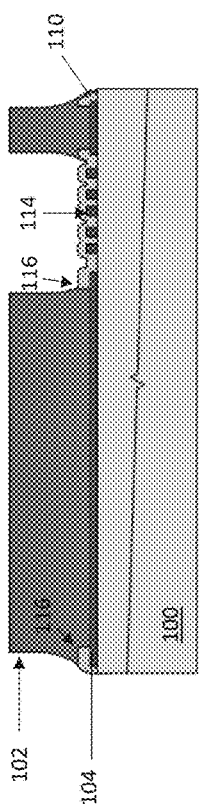

FIG. 7G shows the semiconductor device after annealing which is performed to complete the power metallization structure 102.

FIGS. 8A through 8E illustrate an embodiment of a method of manufacturing a semiconductor device, wherein the intermediate layer 108 is an adhesion promoting layer configured to increase adhesion of the power metallization structure 102 to the barrier layer 104 in a region of the device.

FIG. 8A shows the semiconductor device after a barrier layer 104 configured to prevent diffusion of metal atoms from above the barrier layer 104 in a direction toward a semiconductor substrate 100 is formed over the substrate 100. The barrier layer 104 may be in contact with the semiconductor substrate 100 as shown in FIG. 8A, or may be separated from the semiconductor substrate 100 by one or more insulating layers. In either case, the semiconductor substrate 100 may be any type of semiconductor substrate typically used to implement logic and/or power semiconductor devices. The barrier layer 104 may be annealed with nitrogen to increase its ruggedness.

FIG. 8B shows the semiconductor device after the barrier layer 104 is structured, e.g., by plasma etching process using a lithography mask (not shown) such as a photoresist. The reticle design of the lithography mask and the dimensions of the openings 600 formed in the barrier layer 104 define the range of positive edge length (x) for the barrier layer 104. The mask is then removed and the structure cleaned to remove mask residue.

FIG. 8C shows the semiconductor device after a power metallization process. An adhesion promoting intermediate layer 108 such as TiW or Ti is deposited in-situ with a thick Cu power metal layer 602 over the barrier layer 104, e.g., via a sputter process. In this embodiment, the intermediate layer 108 acts as an adhesion promoter between the underlying barrier layer 104 and the overlying thick Cu power metal layer 602. In another embodiment, the adhesion promoting intermediate layer 108 is a TiW/Cu seed layer deposited over the barrier layer 104 and the thick Cu power metal layer 602 is electrochemically deposited with resist on the TiW/Cu seed layer. In either case, the adhesion promoting intermediate layer 108 is substantially thinner than the Cu power metal layer 602, e.g., about 50 nm in the case of a TiW adhesion promoting intermediate layer.

FIG. 8D shows the semiconductor device after a mask 604 such as a photoresist is formed on the Cu power metal layer 602. The mask 604 has openings 606 aligned with the features previously structured into the barrier layer 104.

FIG. 8E shows the semiconductor device after isotropically etching the Cu power metal layer 602 and the adhesion promoting intermediate layer 108 through the openings 606 in the mask 604 to structure/pattern the power metallization structure 102. The isotropic etching provides a well-defined positive edge/step 608 in the barrier layer 104 with respect to the power metallization structure 102. That is, the edges 608 etched into the barrier layer 104 laterally extend further than the edges 610 etched into the power metallization structure 102.

The positive edge/step 608 in the barrier layer 104 increases the distance for metal electromigration between a power terminal of the semiconductor device and a control terminal of the device, and also more uniformly distributes stress in the ILD induced during thermal cycling of the power metallization structure 102. Accordingly, the positive edge/step 608 in the barrier layer 104 reduces stress at the etched edge 608 of the barrier layer 104 which may otherwise lead to cracks or delamination. FIG. 8E includes an exploded region, which shows the barrier layer 104 laterally extending beyond the etched side faces 610 of the power metallization structure 102 in regions aligned with the openings 606 in the mask 604 by an amount x which may be in a range, e.g., between 500 nm and 5 microns.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
    forming a barrier layer above a semiconductor substrate, the barrier layer configured to prevent diffusion of metal atoms from above the barrier layer in a direction toward the semiconductor substrate;
    structuring the barrier layer; and
    after structuring the barrier layer, forming a power metallization structure above the structured barrier layer without forming an additional barrier layer for the power metallization structure, the power metallization structure being in direct contact with the barrier layer or an electrically conductive layer formed on the barrier layer in a first region,
    wherein forming the power metallization structure comprises:
        after structuring the barrier layer, forming an adhesion promoting layer on the barrier layer and a Cu layer on the adhesion promoting layer, the adhesion promoting layer configured to increase adhesion of the power metallization structure to the barrier layer in the first region;
        forming a mask on the Cu layer, the mask having openings aligned with features previously structured into the barrier layer; and
        isotropically etching the Cu layer and the adhesion promoting layer through the openings in the mask, to structure the power metallization structure and so that the barrier layer laterally extends beyond side faces of the power metallization structure in regions aligned with the openings in the mask.

2. The method of claim 1, further comprising:
    before structuring the barrier layer, forming a protective layer on the barrier layer which is configured to prevent oxidation of the barrier layer during the structuring.

3. The method of claim 2, wherein the protective layer comprises AlCu and the barrier layer comprises TiW.

4. A method of manufacturing a semiconductor device, the method comprising:
    forming a power metallization structure above a semiconductor substrate;
    forming a barrier layer between the power metallization structure and the semiconductor substrate, the barrier layer configured to prevent diffusion of metal atoms from the power metallization structure in a direction toward the semiconductor substrate, the power metallization structure being in direct contact with the barrier layer or an electrically conductive layer formed on the barrier layer in a first region, a passivation layer being interposed between the barrier layer and the power metallization structure in a second region; and
    structuring the barrier layer as a signal routing structure in the second region,
    wherein the power metallization structure is disposed over the signal routing structure in the second region,
    wherein the signal routing structure is insulated from the power metallization structure by the passivation layer in the second region.

5. The method of claim 4, further comprising structuring the power metallization structure independently of the signal routing structure in the second region.

6. The method of claim 4, wherein the first region and the second region are directly adjoining, wherein the power metallization structure and the barrier layer are unpatterned in the first region, and wherein the passivation layer covers a periphery of the barrier layer in the second region.

7. The method of claim 6, wherein the barrier layer laterally extends beyond side faces of the power metallization structure in the second region.

8. The method of claim 4, further comprising:
    forming an intermediate layer, the intermediate layer being interposed between the barrier layer and the passivation layer in the second region; and
    structuring the intermediate layer identically as the barrier layer in the second region.

9. The method of claim 8, wherein the barrier layer comprises TiW, the intermediate layer comprises AlCu and the power metallization structure comprises Cu.

10. The method of claim 4, further comprising:
    forming an intermediate layer, the intermediate layer being interposed between the passivation layer and the power metallization structure in the second region.

11. The method of claim 4, further comprising:
    omitting the power metallization structure above the barrier layer in the second region.

12. A method of manufacturing a semiconductor device, the method comprising:
    forming a power metallization structure above the semiconductor substrate;
    forming a barrier layer between the power metallization structure and the semiconductor substrate, the barrier layer configured to prevent diffusion of metal atoms from the power metallization structure in a direction toward the semiconductor substrate, the power metallization structure being in direct contact with the barrier layer or an electrically conductive layer formed on the barrier layer in a first region;
    forming a passivation layer interposed between the barrier layer and the power metallization structure in a second section of a second region; and
    structuring the barrier layer as a signal routing structure in a first section of the second region, wherein the first section of the second region is spaced apart from the first region by the second section of the second region, wherein no metallization structure is present above the signal routing structure.

13. A method of manufacturing a semiconductor device, the method comprising:

forming a barrier layer above a semiconductor substrate, the barrier layer configured to prevent diffusion of metal atoms from above the barrier layer in a direction toward the semiconductor substrate;

forming a protective layer on the barrier layer and which is configured to prevent oxidation of the barrier layer during the structuring;

structuring the protective layer and the barrier layer;

after structuring the protective layer and the barrier layer, forming a Cu seed layer on the protective layer;

forming a mask on the Cu seed layer in a second region;

forming a Cu layer on the Cu seed layer in a first region but not in the second region where the mask is present; and after forming the Cu layer, removing the mask and the Cu seed layer from the protective layer in the second region.

14. A method of manufacturing a semiconductor device, the method comprising:

forming a barrier layer above a semiconductor substrate, the barrier layer configured to prevent diffusion of metal atoms from above the barrier layer in a direction toward the semiconductor substrate;

forming a protective layer on the barrier layer which is configured to prevent oxidation of the barrier layer during the structuring;

structuring the protective layer and the barrier layer;

after structuring the protective layer and the barrier layer, forming a passivation layer on the protective layer;

removing the passivation layer in a first region but not in a second region;

forming a Cu seed layer on the protective layer in the first region and on the passivation layer in the second region; and forming a Cu layer on the Cu seed layer at least in the first region.

15. The method of claim 14, further comprising:

before forming the Cu layer, forming a mask on the Cu seed layer in the second region so that the Cu layer is formed on the Cu seed layer in the first region but not in the second region where the mask is present; and after forming the Cu layer, removing the mask.

16. The method of claim 14, wherein the barrier layer is structured in the second region as a signal routing structure, the method further comprising:

structuring the Cu layer in the second region independently of the signal routing structure.

17. A method of manufacturing a semiconductor device, the method comprising:

forming a barrier layer above a semiconductor substrate, the barrier layer configured to prevent diffusion of metal atoms from above the barrier layer in a direction toward the semiconductor substrate;

forming a protective layer on the barrier layer which is configured to prevent oxidation of the barrier layer during the structuring;

structuring the protective layer and the barrier layer;

after structuring the protective layer and the barrier layer, forming a passivation layer on the protective layer;

removing the passivation layer in a first region but not in a second region; and forming a Cu layer on the protective layer in the first region and on the passivation layer in the second region by physical vapor deposition.

18. The method of claim 17, further comprising:

removing the Cu layer from the passivation layer in the second region.

* * * * *